United States Patent [19]

Kadah et al.

[11] Patent Number: 5,589,753
[45] Date of Patent: Dec. 31, 1996

[54] RATE EFFECT MOTOR START CIRCUIT

[75] Inventors: Andrew S. Kadah, 6333 Daedulus Dr., Cicero, N.Y. 13039; Benjamin V. Morrow, Pennellville, N.Y.

[73] Assignee: Andrew S. Kadah, Cicero, N.Y.

[21] Appl. No.: 225,581

[22] Filed: Apr. 11, 1994

[51] Int. Cl.⁶ .................................. H02P 1/42; H02P 1/44
[52] U.S. Cl. .............................. 318/785; 318/786
[58] Field of Search ............................ 318/778, 785, 318/788

[56] References Cited

U.S. PATENT DOCUMENTS

| | | | |
|---|---|---|---|
| 3,657,620 | 4/1972 | Fricker | 318/786 |
| 3,740,632 | 6/1973 | Whitney et al. | 318/289 |
| 3,746,951 | 7/1973 | Hohman | 318/786 |
| 3,761,792 | 9/1973 | Whitney et al. | 318/786 |
| 3,832,612 | 8/1974 | Woods | 318/786 |
| 4,382,217 | 5/1983 | Horner et al. | 318/778 |
| 4,605,888 | 8/1986 | Kim | 318/786 |
| 4,651,077 | 3/1987 | Woyski | 318/781 |
| 4,770,417 | 9/1988 | Blair | 318/484 X |

*Primary Examiner*—Brian Sircus
*Attorney, Agent, or Firm*—Trapani & Molldrem

[57] ABSTRACT

A start circuit for a single phase AC induction motor employs a triac or similar device in series with the motor start or auxiliary winding. The triac device has associated circuitry so that it turns on in response to an increase in the time rate of change of applied voltage. In one version a PNP transistor and a capacitive timing circuit are employed to cut in the start winding. In another version a second, pilot triac is employed.

18 Claims, 6 Drawing Sheets

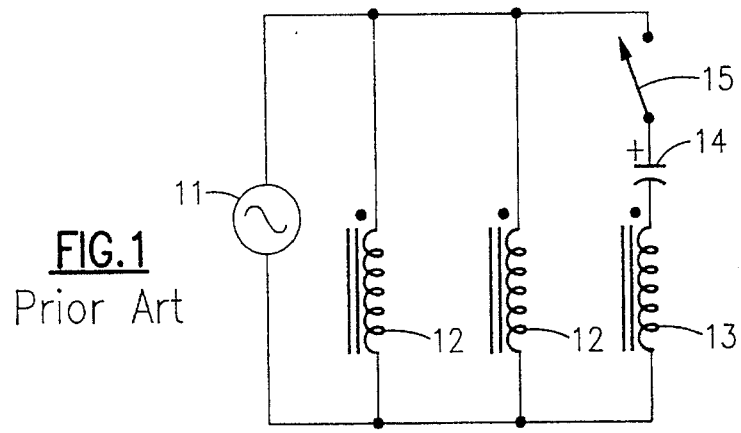
FIG.1 Prior Art
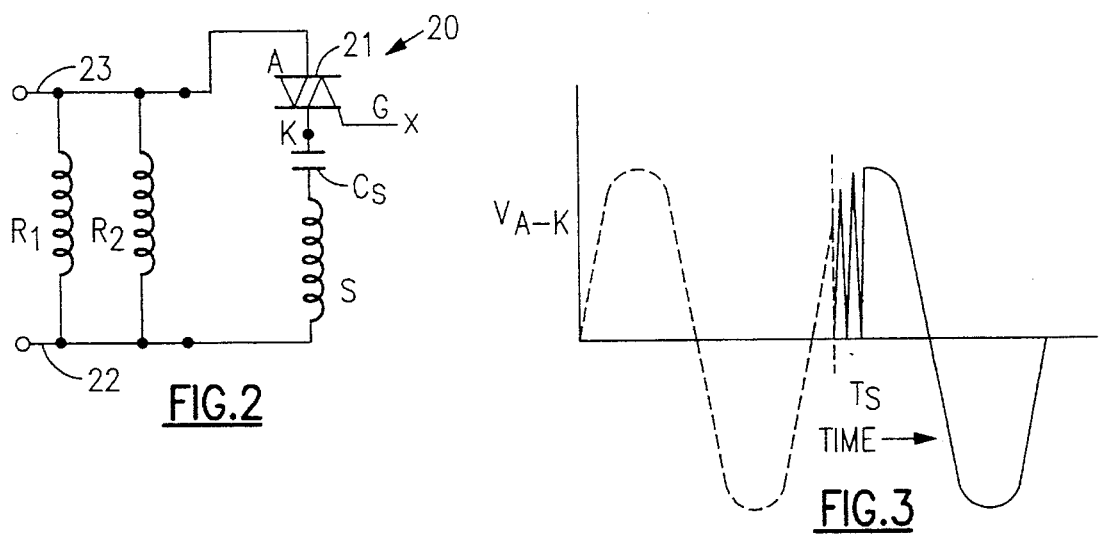
FIG.2
FIG.3
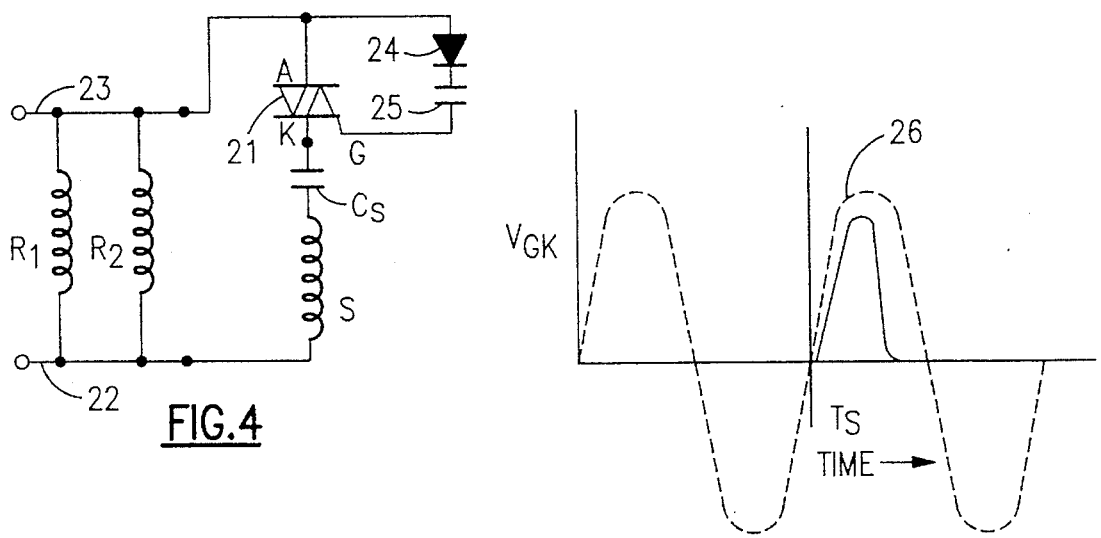
FIG.4
FIG.5

RATE EFFECT MOTOR START CIRCUIT

BACKGROUND OF THE INVENTION

This invention relates to starting systems for AC induction motors, and is more particularly concerned with a solid-state motor start circuit that supplies AC current to the motor auxiliary or start winding on the basis of voltage potential in the auxiliary winding.

At start-up, AC single-phase induction motors require some sort of starting mechanism to rotate the magnetic field of the field windings so as to generate sufficient torque to start the rotor. The starting mechanism enables the rotor to overcome the static forces associated with accelerating the rotor and load, for example, from a zero initial angular velocity.

The typical single-phase induction motor armature is equipped with two sets of windings, namely one or more run windings for driving the motor at normal operating speed, and an auxiliary winding or start winding to generate the required starting torque. In order to provide the necessary rotating magnetic field for start-up, a phase shift device such as a capacitor is connected in series with the start winding. During start-up, both the run winding(s) and the auxiliary or start winding(s) are energized to bring the motor up to a sufficient operating speed. At that point, the start or auxiliary winding drops out of circuit so that the motor operates on the run windings only, for more efficient operation. In the event that a heavy load is encountered and the motor rpm slows significantly below the design operating speed, the auxiliary winding cuts back in to increase motor torque to overcome the increased load.

In most AC induction motors, the structure of the auxiliary winding is such that sustained connection to the AC line voltage could cause overheating and damage. For capacitor-type motors, the start capacitor can also sustain damage from sustained connection. Therefore, the start mechanism should both connect and disconnect at the proper times during and after start-up and during and after high load conditions.

One conventional approach to control of the start circuit employs a centrifugal switch. The centrifugal switch is an electromechanical device that is usually located on the armature or shaft of the rotor. Alternatively, an electromechanical current-sensing relay can be used. These devices have limited lifetimes because of arcing and wear problems.

Centrifugal switches are also susceptible to humidity, dust, or corrosives in the atmosphere and typically have a life expectancy far below 1,000,000 operations at full load. Centrifugal switches can pit and then weld closed so that AC current is applied continuously to the start windings. Also, as the device ages, the cut-in and cut-out speeds of the centrifugal switch can vary.

A reed-switch/triac start control circuit is described in U.S. Pat. No. 3,766,457 to Fink et al. There the magnetic field generated by the run windings actuates a reed switch which gates a triac on. This type of switch has a strong positional sensitivity and reed switch noise can cause misoperation.

A solid-state motor start circuit is described in Lewus U.S. Pat. No. 3,916,275. Lewus' approach is to measure the voltage across a current sense resistor in line with the run windings, and if the voltage exceeds a trigger threshold a gate signal is applied to a triac in series with the start winding. Because some power is consumed across the sense resistor, this resistor must be as small a value as possible. However, this necessitates the triac having an extremely high gate sensitivity. The high gate sensitivity makes calibration difficult. Also, the Lewus circuit is strongly sensitive to fluctuations in line voltage.

With this type of circuit it is not possible to stack triacs for higher voltage operation.

Another solid state motor start circuit is described in Kadah U.S. Pat. No. 4,820,964. In that circuit a solid state switch, such as a triac, is used to control the start current, and the switch is gated by a photosensitive element. A light-emitting element bridges across an impedance in series with the run windings to produce an output that varies in proportion with the field current. A light conduit connects the light emitting element to the photosensitive element. This circuit is relatively insensitive to temperature and voltage fluctuations, and is not difficult to calibrate. However, it does require a series impedance in circuit with the run windings.

OBJECTS AND SUMMARY OF THE INVENTION

It is an object of this invention to provide an improved motor starting circuit which is simple, employs a minimum of components, is highly reliable, and overcomes or avoids the drawbacks and limitations of the prior art.

It is another object to provide a solid state motor start circuit that relies on time rate of change of voltage to actuate the application of AC current through the auxiliary or start winding.

It is a further object to provide a low-cost reliable start circuit that can be easily connected to an AC induction motor, and which can reliably cut in and cut out at the appropriate times.

In keeping with several possible embodiments of this invention, the motor start circuit for an AC induction motor is provided in series with the motor start windings (and start capacitor in the case of a capacitor motor) for applying AC current to the start winding and start capacitor when AC current is cut in for the main or run windings. The start circuit removes AC current when the motor is rotating at or near its design operating speed, and re-connects AC current to the start winding when the motor speed falls below the design operating speed, for example if a high torque load is applied to the motor shaft.

To accomplish this end, the motor start circuit comprises a triac device whose main current electrodes are connected in series with the start winding and start capacitor, and gating means to produce a low dV/dt characteristic in the triac device so that commencement of the application of current causes AC current to flow through the main current path between the main electrodes.

In its simplest form, the triac device can be a triac with a very low resistance to voltage rate of change across its two main terminals. That is, with a low dV/dt triac, the chatter or arcing associated with the switch closure will be sufficient to gate the triac. Then, at operating speed the voltage across the start winding and the voltage across the start capacitor will be equal and opposite in phase, causing the current of the triac to fall below its holding current level, so that the triac turns off.

In other arrangements the low dV/dt producing means can comprise a capacitor, a diode, or a negative resistance device between the second main terminal and the gate.

A motor restart circuit can preferably be coupled to the gate of the triac to apply a restart triggering current to the gate when there is an excessive load on the motor. When the motor's operating speed drops some predetermined level below the design operating speed, the restart circuit regates the triac.

In one preferred embodiment, the restart circuit can include a transistor device, e.g. a PNP transistor, having a first current-carrying electrode coupled to the second main current electrode of the triac, a second current-carrying electrode coupled to the gate of the triac, and a control electrode (e.g. the gate or base). A capacitor timing circuit is connected between the control electrode and the AC line. The transistor device conducts when current is first applied. This gates the triac on and bring AC current to the start winding. Then after a short interval, e.g. 200 milliseconds, the timing circuit charges up and shuts the transistor off. This permits the triac to gate off as soon as the motor comes up to speed. Then, as long as the motor is at its design run speed, the capacitor of the timing circuit is kept charged. If the motor speed drops, the induced voltage on the starting winding falls, and the transistor device can no longer keep the capacitor charged up. After a short interval, current flows again in the transistor device, which gates on the triac and re-energizes the start winding.

A simple version of this circuit employs a PNP transistor, but alternative circuits could employ a PUT, an NPN or an FET transistor, or a multiple device such as a darlington.

In another possible embodiment, a triac is coupled in series with the start capacitor and start winding, with an RC network coupled between the first and second main current terminals of the triac. A diac, sidac, or other negative resistance device can be coupled between a node on this network and the gate of the triac. A second triac has its first main terminal coupled to the first main terminal of the first triac and its second main terminal coupled to a node of the network. There is a also a voltage dividing network connected between the first main terminal of the second triac and the other side of the start winding, and a junction or node of this network is coupled to the gate of the second triac. If the motor speed drops below operating speed, the induced voltage across the start winding falls. This gates off the second triac, which causes a gating pulse to pass through the diac to the gate of the first triac. This gates the first triac on to reconnect AC current to the start winding and start capacitor.

The above and many other objects, features, and advantages of this invention will become apparent from the ensuing description of several preferred embodiments, to be read in connection with the accompanying Drawing.

BRIEF DESCRIPTION OF THE DRAWING

FIG. 1 is a schematic diagram of an AC induction motor with a centrifugal switch of the prior art.

FIG. 2 is a simple schematic diagram of a start circuit according to one embodiment of this invention.

FIG. 3 is a voltage wave chart for explaining the operation of the circuit of FIG. 2.

FIG. 4 is a schematic diagram of an alternative embodiment.

FIG. 5 is a voltage wave chart for explaining the operation of the circuit of FIG. 4.

DETAILED DESCRIPTION OF THE PREFERRED EMBODIMENT

Figure 6:
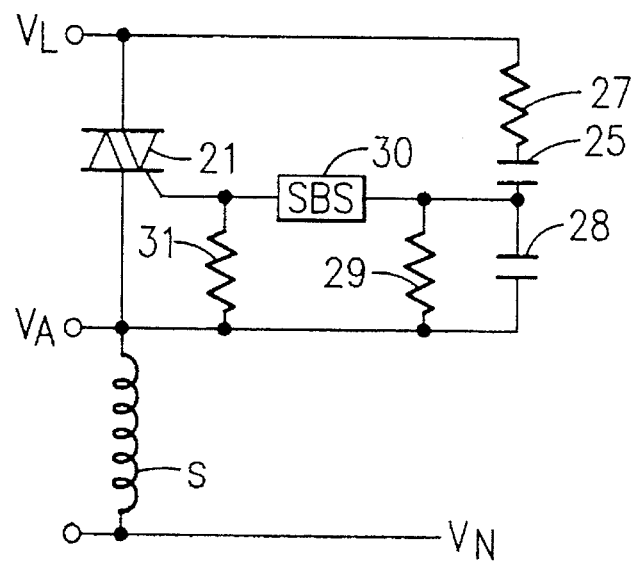
FIGS. 6, 7 and 8 illustrate further alternative embodiments of this invention.

With reference to the Drawing and initially to FIG. 1, an AC single phase induction motor 10 is coupled to a source 11 of an AC line voltage and has an armature that is formed of field windings that include at least one run winding 12 (here a pair of run windings in parallel) and a start winding 13. The start winding is connected in series with a start capacitor 14 and a centrifugal switch 15, these three elements being connected as a series circuit across the run windings 12. The capacitor 14 and start winding 13 have their values selected so as to create a ninety-degree phase shift for start up.

When the motor armature is first energized, the centrifugal switch is closed and AC current flows in the run windings 12 and also in the field windings 13. Because of the phase difference between the current in these winding the armature creates a rotating magnetic field. After the rotor (not shown) has attained a design operating speed, the centrifugal switch 15 opens, and AC current flows only in the run windings 12. If the rotor speed drops, the centrifugal switch again closes and reenergizes the start winding 13 (sometimes called the auxiliary winding) to increase motor torque to match the load on the rotor.

Not shown are a heater resistor and thermal cutout switch, which are conventional on motors of this type.

The centrifugal switch is an electromechanical element, which is subject to wear, arcing and other aging problems, and is difficult to calibrate to a desired rotor speed. Also, because it is partly mounted on the rotor, the centrifugal switch has to accommodate both axial and rotary mechanical stress.

The circuit shown in FIG. 1 is a typical dual voltage AC induction motor and the two run windings 12,12 can be switched between series and parallel for 240 or 120 volt operation. Also, the position of the switch 15, capacitor 14 and winding 13 are interchangeable, and for split-phase motors, the start capacitor 14 would be omitted.

The basic principles of this invention can be explained with reference to FIGS. 2 and 3, which illustrate the structure and behavior of a motor start circuit according to the simplest of the embodiments of this invention. Here, the basic motor armature comprises run windings $R_1$ and $R_2$ and a start winding S connected in series with a start capacitor $C_S$. In this version, a motor start circuit 20 comprises a triac 21 whose first and second main terminals, i.e. anode and cathode, are connected in series with the start winding S and capacitor $C_S$ between the AC power conductors 22 and 23, and the gate of the triac 21 is not active. In this case, the triac 21 is selected to have a rather high sensitivity to the rate of change of voltage between its main terminals, i.e., between anode A and cathode K. As shown in FIG. 3, a few rather steep voltage spikes occur immediately after the time of switch actuation $T_S$. These spikes can be the result of bounce or chatter in the switch, or can be induced upon energization.

These spikes cause the triac 21 to break down and conduct. The triac will continue to conduct because the current and voltage of the start winding and capacitor S,$C_S$ are out of phase, and do not both go to zero simultaneously. However, once the motor approaches its design operating speed, the current at the second main terminal of the triac 21 will reach zero when the capacitor and auxiliary winding current phasors are equal and opposite, and the AC current approaches zero. This allows the triac to gate off. Thereafter the start winding will remain out of circuit until power is removed and reapplied to the run windings.

In this case, a manual switch or push button can be used to gate the triac 21 if conditions require reenergizing the start winding.

An alternative embodiment is shown in FIG. 4 where elements in common with the FIG. 3 embodiment are identified with the same reference characters. Here the triac 21 has a gating circuit connected between its second main terminal and its gate. This circuit includes a capacitor 25. The capacitor has its value selected to permit a current spike 26 (FIG. 5) to appear at the triac gate when power is first applied to the AC conductors 22, 23 to cut in the start winding S. The capacitor 25 in effect creates a high time rate of change in the voltage applied to the triac gate.

In the embodiments of FIG. 2 and FIG. 4, for example, a mechanically or manually actuated switch can be tied to the gate of the triac 21 to reinitiate start current when desired.

FIG. 6 shows an embodiment in which the current for gate electrode of the triac 21 is obtained at the junction of a pair of capacitors 25, 28 in series with a resistor 27 that is connected to the anode or main terminal of the triac. The capacitor 28 has an electrode coupled to the other main terminal, or cathode of the triac. A silicon bilateral switch or SBS 30 is coupled between the junction of the capacitors 25, 28 and the gate of the triac, with a resistor 29 connected at one side of the SBS and to the cathode of the triac 21, and with another resistor 31 connected between the gate and cathode of the triac 21.

The device of this embodiment is a reversible, two-wire device, with one side connected to the line voltage $V_L$ and the other side connected to the start winding S where the start or auxiliary voltage $V_A$ appears. The connections can be inverted without affecting the performance of the device. A "neutral" voltage $V_N$ appears on the other end of the start winding S.

In this embodiment, the auxiliary winding S acts as a transformer and applies a voltage to the cathode of the triac whose magnitude and phase depend on the speed of the rotor (not shown). The triac 21 will gate on with initial current inrush, and will gate off at approximately 80% of motor speed.

This circuit has a restart feature. While the motor speed is high, the auxiliary winding applies adequate voltage at each cycle to the triac cathode to keep the triac from gating on. Line voltage $V_L$, applied through the charging circuit comprised of capacitor 25 and resistor 27, charges the capacitor 28 until the threshold voltage of the SBS 30 is overcome, e.g. 10 volts. As long as motor speed remains high, voltage appears at the triac cathode before the SBS 30 beings to conduct, and the triac 21 remains off. However, if motor speed drops, the voltage $V_A$ falls in voltage and in phase. Below some predetermined speed, a high gate voltage appears before the cathode voltage rises, and the triac 21 becomes gated on. At this time, the start winding S is supplied with current and the motor receives additional torque to meet its increased load.

The device 30 is not limited to being an SBS, but could be a diac or any negative resistance device, or could be a neon tube or other arcing device.

Figure 7:
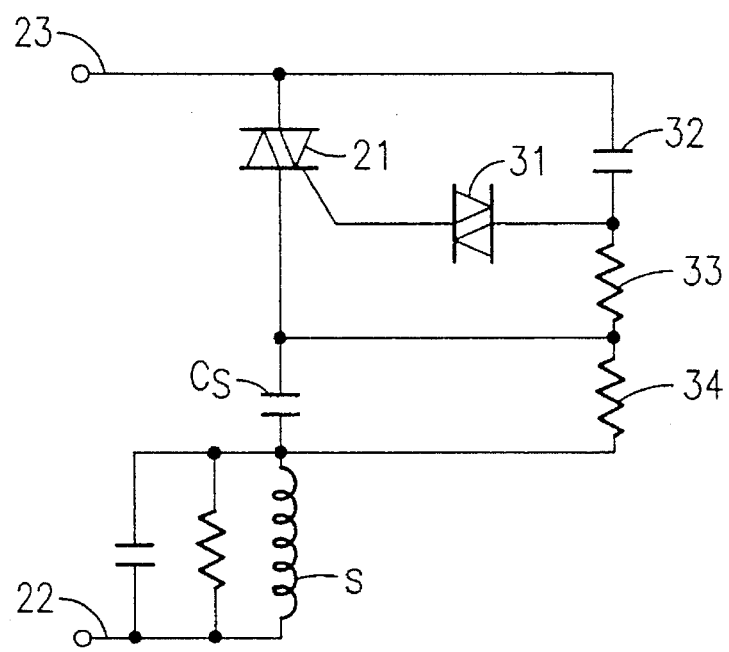

FIG. 7 shows a start circuit in which a negative resistance device, here a diac 31, is connected to the gate of the triac 21, the later being connected in series with the start capacitor $C_S$ and start winding S. A series circuit comprised of a capacitor 32, and optional first and second series resistors 33 and 34, bridges from the upper AC power input 23 to the junction of the start capacitors $C_S$ and start winding S. The junction of the resistors 33 and 34 is tied to the junction of the triac first main terminal and the start capacitor $C_S$, while the junction of the capacitor 32 and the resistor 33 is tied to the diac 31.

Figure 8:
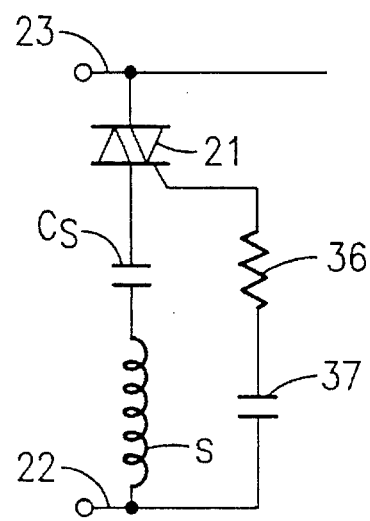

FIG. 8 illustrates an alternative arrangement to that of previously described embodiments; differing insofar as the gate of the triac 21 is coupled via a resistor 36 and a capacitor 37 to the other AC power conductor 22.

Figure 9:
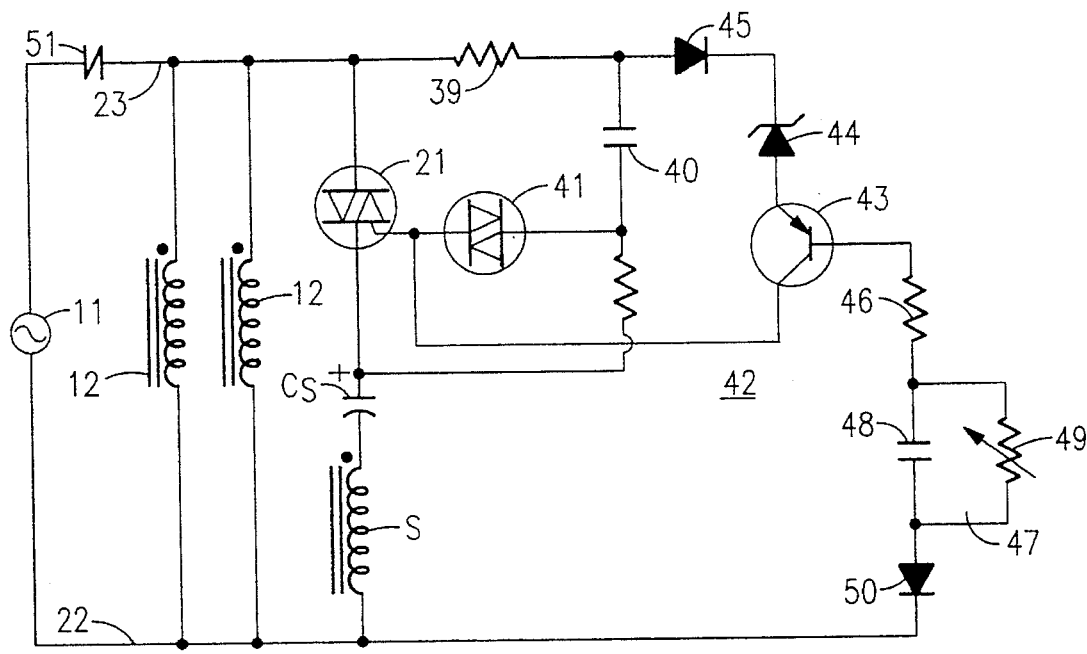
FIG. 9 is a schematic circuit diagram of another embodiment featuring a transistor regate circuit.

A motor start circuit with a restart feature is shown in the embodiment of FIG. 9. Here elements in common with previous embodiments are identified with similar reference numbers. The triac 21 is connected with its main current terminals in series with the start winding S and start capacitor $C_S$ between the AC power conductors 22 and 23. An optional current limiting resistor 39 is tied to the AC conductor 23, and a series circuit formed of a capacitor 40 and a diac 41 connects from this resistor 39 to the gate of the triac 21. This series circuit gates the triac on at the onset of application of power to the run windings 12.

Also included here is a restart circuit 42 which includes a PNP transistor 43 whose collector is tied to the triac gate and whose emitter is coupled through an optional zener diode 44, a rectifier diode 45 and the resistor 39 to the AC conductor 23. The base of the transistor 43 is coupled through an optional current limiter resistor 46 to a timing circuit 47 formed of a timing capacitor 48 and a resistor 49. The timing circuit has a time constant on the order of several line cycles to a few seconds. The distant side of the resistor 49 and capacitor 48 are coupled through an optional rectifier diode 50 to the other AC conductor 22.

When the motor is running at its design operating speed, there is a high back EMF on the start winding, which holds the triac gate high. This voltage, on positive cycles, passes through the collector-base junction of the transistor 43 to keep the capacitor 48 charged up. However, if the load on the motor reduces its operating speed, the back EMF on winding S drops, and the charge on capacitor 48 bleeds off through the timing resistor 49. The base voltage on the transistor 43 falls until the transistor 43 begins to conduct. Then, collector current starts to flow and is fed from the collector of the transistor 43 as a triggering current to the gate of the triac 21. This brings the start winding S back on line and adds motor torque.

In this embodiment a thermal cutout switch 51 is shown in advance of the run windings 12 in the ac conductor 23. Also in this embodiment the timing resistor 49 is a variable resistance.

Figure 10:
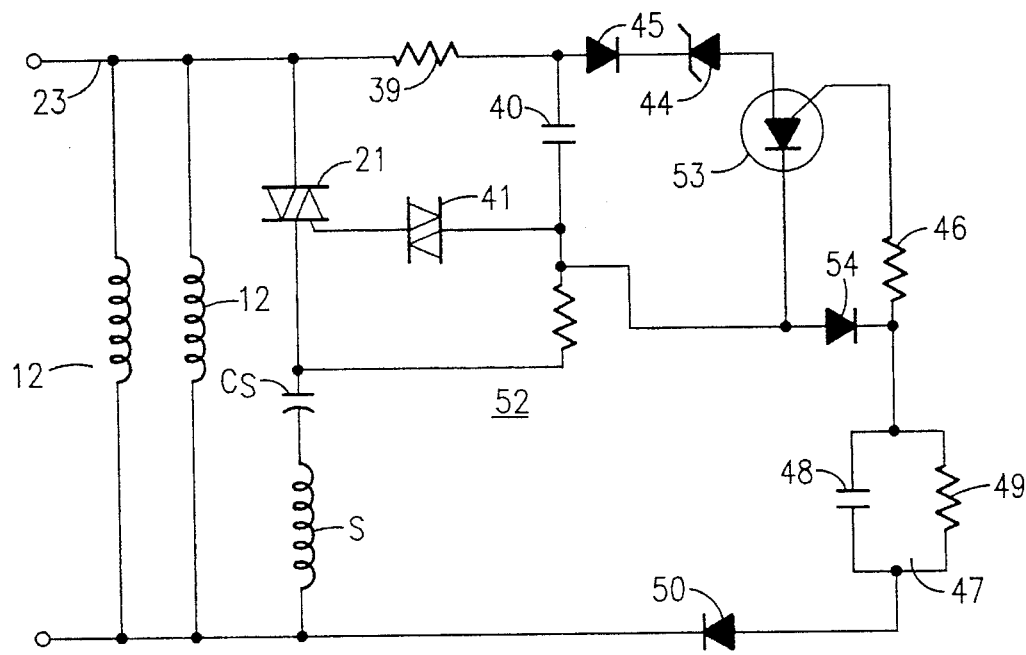
FIG. 10 is a schematic circuit diagram of an alternative embodiment showing another restart circuit.

An alternative version of the embodiment of FIG. 9 is shown in FIG. 10 where elements identical to those in FIG. 10 are identified with the same reference numbers, and a detailed description will not be repeated.

Here a restart circuit 42 is similar to the circuit previously described, except a programmable unijunction transistor (PUT) 53 is employed instead of the PNP transistor. The PUT 53 has its anode coupled to through the zener 44, the diode 45 and the resistor 39 to the AC conductor 23, and has its cathode coupled to the gate of the triac 21. The gate of the PUT 53, similar to the base of the transistor 43, is coupled through the resistor 46 to the timing capacitor 48 and timing resistor 49. A diode 54 is coupled between the gate of the triac 21 and the timing circuit 47. This circuitry functions in a manner similar to that of the previous embodiment, so that the triac 21 is gated back on when the motor speed falls below its design operating speed.

Figure 11:
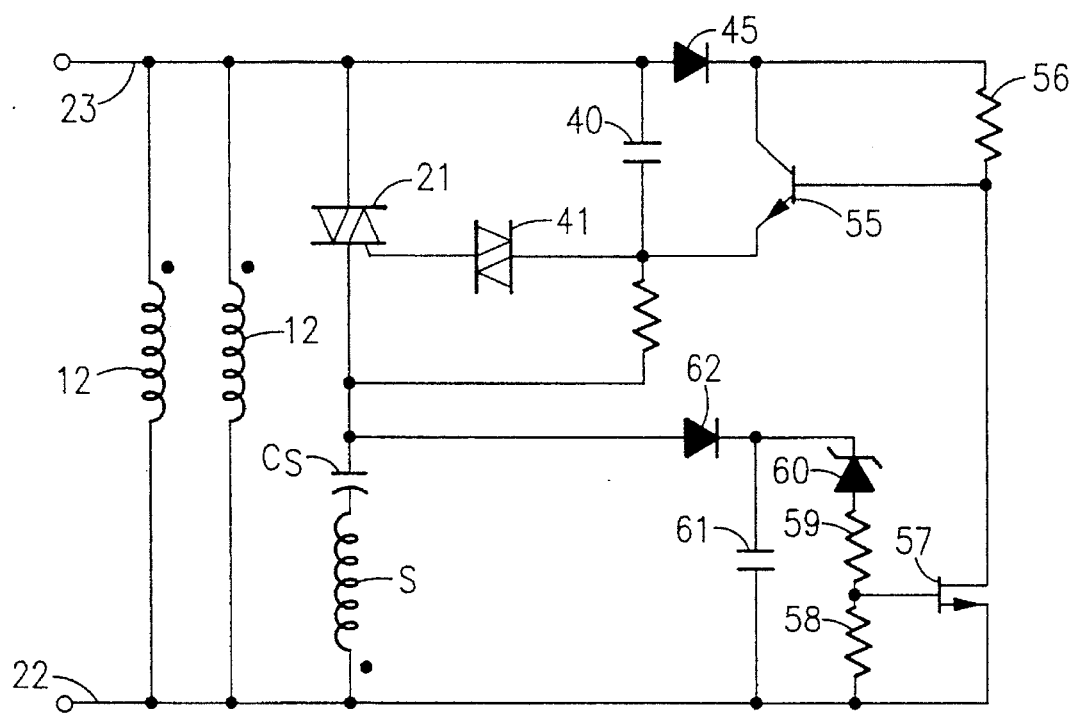
FIG. 11 is a schematic circuit diagram of a further alternative embodiment.

A further alternative embodiment is shown in FIG. 11, employing an NPN transistor 55 whose emitter is coupled to the gate of the triac 21. The base of the transistor is coupled through a bias resistor 56 to its collector and through the diode 45 to the AC conductor 23. The base is also coupled through the source-drain path of an FET 57 to the other AC conductor 22. The gate of this FET is coupled to a junction of two series resistors 58, 59 that are in series with a zener 60. These three elements are coupled across a timing capacitor 61, with one end coupled to the AC conductor 22 and the drain of the FET 57. A diode 62 is coupled between a junction of the triac 21 and start capacitor $C_S$ and a junction of the capacitor 61 and zener 60.

When AC power is initiated, the triac gates on, as in previous embodiments, and commutes off when a sufficient back EMF appears on the start winding S to correspond to the motor having reached operating speed. At this time the diode 62 charges up the capacitor 61. This puts a gating voltage at the junction of resistors 58 and 59, and gates the FET 57 on. As a result a low voltage appears at the base of the transistor 55, and the gate of the triac 21 is held off.

When the motor speed is reduced, the back EMF on the winding S drops, and the charge decays from the capacitor 61. When the capacitor voltage is lower than the zener voltage of zener 60, the voltage at the gate of the FET 57 goes low, and the FET 57 stops conducting. This brings the voltage on the base of transistor 55 to a high level, and emitter current begins to flow. This gates the triac 21 back on, and the triac cuts in the start winding until the motor speed increases again to the design operating speed.

Figure 12:
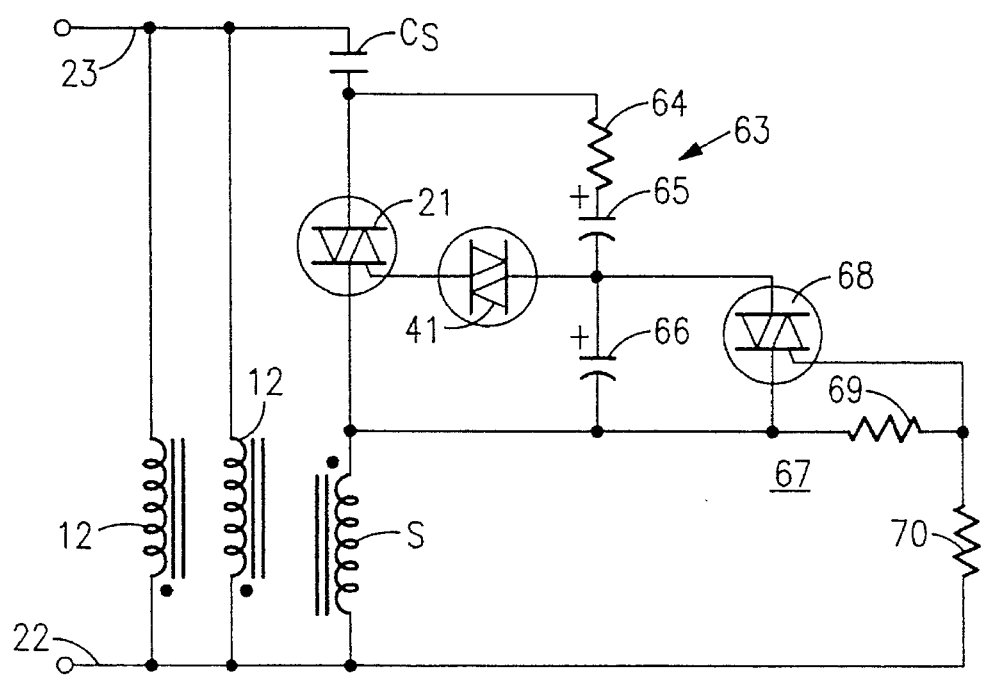
FIG. 12 is a schematic circuit diagram of a two-triac embodiment of this invention.

FIG. 12 illustrates an example of several possible additional embodiments of this invention. Again, elements in common with the previously-described embodiments will be identiffied with similar reference numbers. As in previous embodiments the triac 21 is interposed between the start capacitor $C_S$ and the start winding S, although as discussed previously, the three elements S, $C_S$ and 21 can be transposed.

In this arrangement there is a gating network 63 formed of an optional current-limiting resistor 64 in series with a pair of capacitors 65 and 66, with the resistor 64 connected to the start capacitor $C_S$ and the capacitor 66 connected to the winding S. The capacitor 65 is optional, and serves to limit power dissipation in the resistor 64. Here the diac 41 is coupled from the junction of the capacitors 65,66 to the gate of the triac 21. The diac 21 gates the triac on when power is first applied to energize the start winding. The triac then commutes off when the back EMF on the start winding S rises. The diac-capacitor network 66, 41 continue to gate the triac 21 on so long as the motor is below cutout speed. The cutout speed is determined by the voltage divider formed from resistors 69 and 70 when the voltage of the auxiliary winding S is sufficiently high, the triac 68 conducts and removes charging current from the capacitor 66. This keeps the capacitor 66 from charging to the trigger voltage of the diac 41. Consequently, the triac 21 commutes off on the next line cycle zero crossing.

A restart circuit 67 is based on a second triac 68. This triac 68 is a pilot duty device, with high gate sensitivity. One of the main terminals of this triac 68 is coupled to the junction between the capacitors 65, 66 and thence through the diac 41 to the gate of the triac 21. The other main terminal of the second triac 68 is coupled to the corresponding terminal of the first triac 21 and to the start winding S. The voltage divider pair of resistors 69 and 70 is disposed in parallel with the start winding S, and a junction between these resistor 69, 70 is connected to the gate of the second triac 68. In one possible embodiment, the values of the resistors 69 and 70 are selected at about 1K and about 33K, respectively. The run windings 12 and the start winding S are shown here to be connected in anti-parallel.

The triac 23 and the trigger circuit formed of the resistor 64, capacitor 65 and 66, with the diac 41, act as a free-running multivibrator which continues to run until there is a sufficient back EMF on the start winding S to gate the pilot: triac 68. The conducting pilot triac denies charging current to this multivibrator circuit until the back EMF drops below the cutout speed voltage. This, as mentioned above depends on the values of the resistors 69 and 70.

While the motor speed remains at or near its design operating speed, there will be a large back EMF on the start winding S. The voltage across the resistor 69 will keep the triac 68 gated on. When the motor speed is reduced because of an increased load, the size and phase of the back EMF changes, and the voltage across the resistor 69 is inadequate to keep the second triac 68 on. This allows triggering current to reach the gate of the first triac 21 and turns the first triac on. Then the start winding S cuts back in to add torque to the motor. When the motor regains its design operating speed, the triac 68 goes on and triac 21 goes off.

Figure 13:
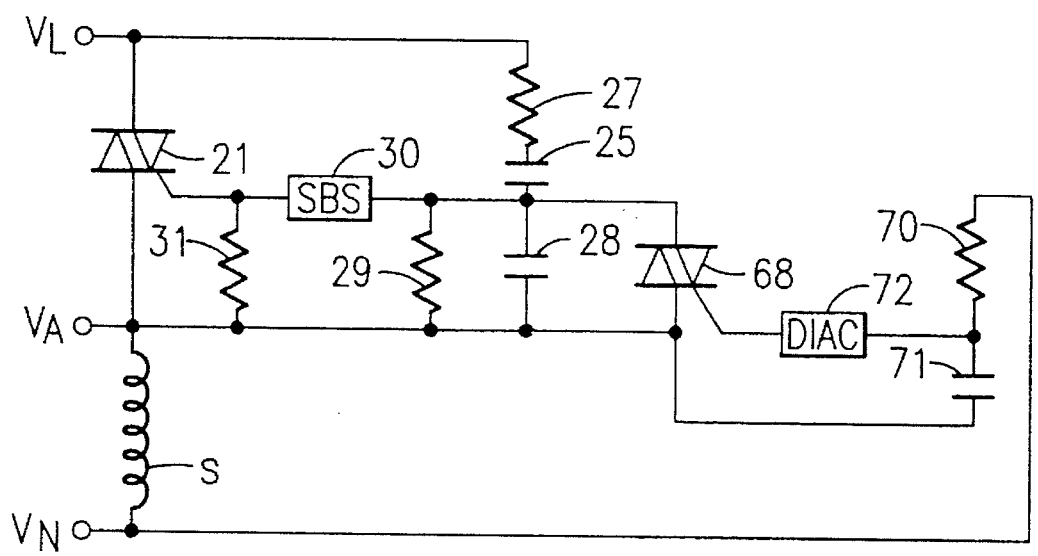
FIG. 13 is a schematic diagram of a further two-triac embodiment.

FIG. 13 shows an embodiment which is similar to that of FIG. 12. Here the motor is a split-phase motor and no start capacitor is employed. In this circuit, resistor 27, capacitors 25, 28 SBS 30 and resistors 29, 31 are connected in the same fashion as FIG. 6.

The pilot triac 68 is connected with its anode and cathode across the capacitor 28. A series circuit comprised of a resistor 70 and a capacitor 71 are connected across the start winding S, i.e., between the voltages $V_N$ and $V_A$. A diac 72 connects between the junction of the resistor 70 and capacitor 71, and the gate of the pilot triac 68.

In this version, the capacitor 28, resistor 29, SBS 30 and the triac 21 form an upper multivibrator while the resistor 70, capacitor 71, diac 72 and pilot triac 68 form a lower multivibrator. Here the SBS 30 can have a breakdown voltage of 10 volts and the diac can have a breakdown voltage of 32 volts. The time constant for the lower multivibrator, e.g., determined by the resistance of resistor 70 and the capacitance of the capacitor 71, can be about 3.5 milliseconds. The time constant for the upper multivibrator, determined by the resistance of resistor 27 and the capacitance of the capacitor 28 can be selected to be 1.0 millisecond. When the motor is not turning, there is a large voltage difference between line voltage $V_L$ and auxiliary voltage $V_S$. At this time, because of tune shorter time constant, the SBS 30 conducts before the threshold voltage of the diac 72 is reached. The triac 21 is gated on and latches. When a predetermined running speed is reached, the auxiliary voltage $V_A$ rises, and the voltage differences falls. This means the upper multivibrator takes longer to reach the conductance of the SBS 30 then the lower multivibrator takes less time to reach conductance of the diac 72. This causes the triac 68 to be gated on, which shunts trigger current away from the main triac 21, thereby gating it off.

When a high load condition reduces the motor speed, the auxiliary voltage $V_A$ falls, and the difference between line and auxiliary voltages becomes great. That condition makes the upper multivibrator faster than the lower multivibrator, which gates the main triac 21 on, and supplies current to the start winding S.

Figure 14:
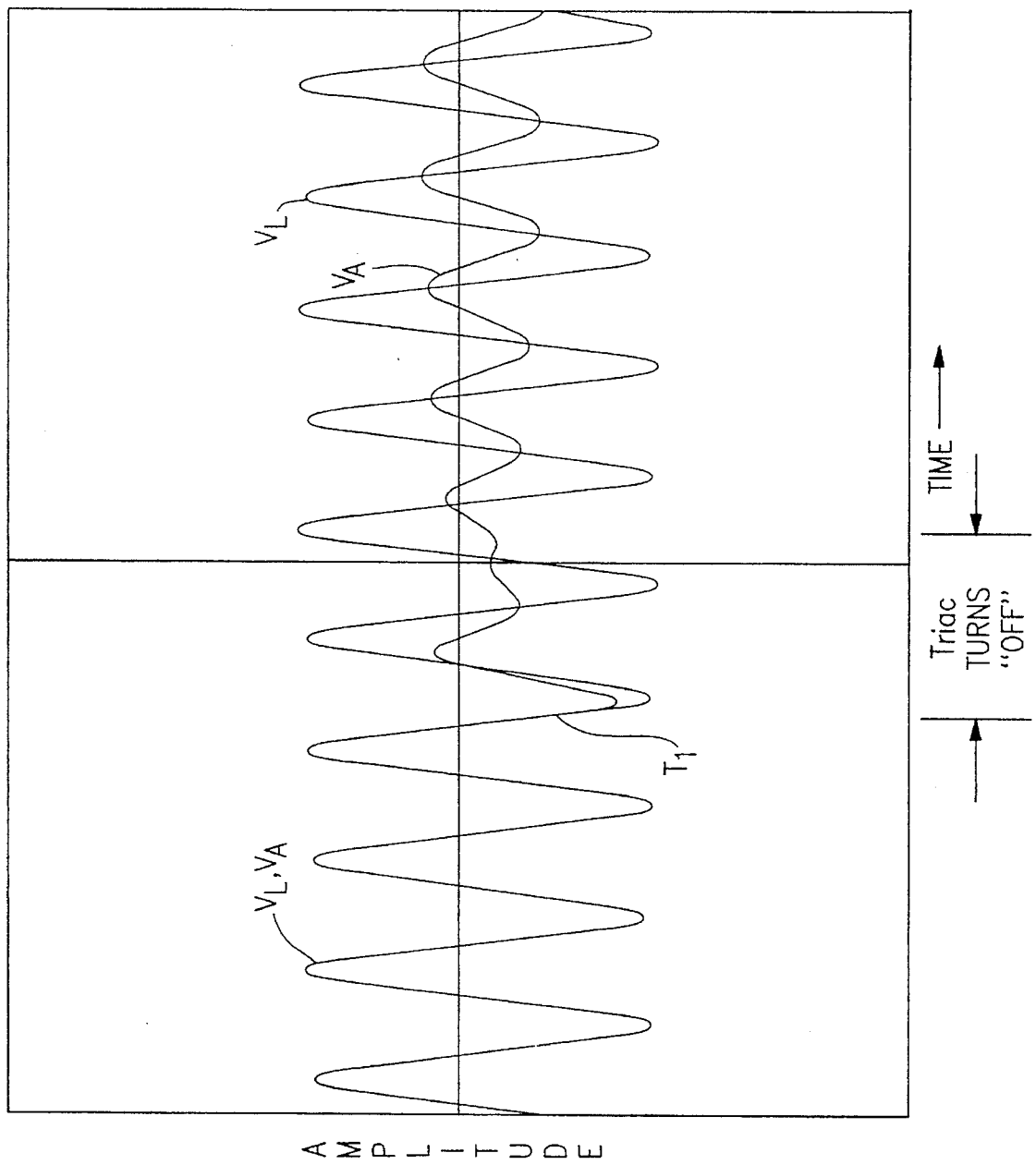
FIG. 14 is a wave chart to explain the operation of this embodiment.

FIG. 14 is a wave chart showing the voltage magnitude and phase for the line voltage $V_L$ which is applied to the run windings and the auxiliary voltage that appears at the switched end of the start winding.

As shown, initially the triac 21 is closed and the line voltage $V_L$ and auxiliary voltage $V_A$ are in phase. The auxiliary voltage and the line voltage are in phase so long as the triac 21 is in conduction. When the motor reaches a sufficient running speed, here at time $T_1$, the triac 21 gates off. The voltage $V_A$ from this time on is created by mutual inductance between the rotor and the start winding S.

There is a transition period of one to two line cycles. When the motor has risen to speed and has generated sufficient voltage to oppose that of the line source, such that the current in the triac 21 is insufficient to hold the triac in conduction, i.e., below a minimum holding current, the triac 21 snaps off. At this time there is no trigger pulse being delivered. This permits generator voltage to reach from the auxiliary winding to the triac 68 to gate it on. This generator voltage $V_A$ is significantly out of phase with the line voltage $V_L$, so that a preceding half cycle of the generator voltage $V_A$ gates the triac 68. This denies charging of the main triggering circuit 25, 27, 28 of the main triac 21 and keeps the auxiliary winding S held out of conduction, so long as the relation of the line and auxiliary voltages persists.

Loading of the motor will decrease the motor speed, and will reduce the phase difference and magnitude of the voltage $V_A$ induced in the auxiliary winding. The triac 28 will act later in the cycle, and will become ineffective to retard the trigger circuit for the main triac 21. This permits the triac 21 to go into conduction, and energizes the auxiliary winding S. When the motor again reaches sufficient speed, the triac 68 will disable the triac 21. The inverted auxiliary voltage leads the line voltage. This means that the lower multivibrator circuit 70, 71, 72 will continue to gate the pilot triac 68 on prior to a rise in voltage in the upper multivibrator circuit 28, 29, 30. The triac 21 stays gated off and will not conduct.

However, if a high torque is applied and the rotor stalls, the induced, auxiliary voltage will retard and decrease in magnitude. At some reduced speed, because of a shift in the timing of the upper and lower multivibrator circuits, the triac 21 will gate on before the pilot triac, and this reenergizes the start winding.

So long as the motor is running at normal speed, and the auxiliary voltage $V_A$ stays ahead of the phase of the line voltage $V_L$, the pilot triac 68 will turn on during the negative half cycles of the auxiliary voltage and throughout the rising part of the line voltage cycle, i.e. during the part of the line voltage cycle when dv/dt is positive. This keeps the time rate of change of the line voltage from turning the triac 21 on. However, increased load on the motor will shift the phase relations of $V_A$ and $V_L$, and at a given high load, the triac 68 will no longer hold the triac 21 off.

The triacs 21 and 68 represent a class of gated active solid state AC devices. Other devices could be employed in their place. For example, a pair of back-to-back SCRs or a pair of PUTs could be used with appropriate circuitry. Also, the biasing networks of these embodiments could be reconfigured in a number of known ways without altering the main circuitry. Moreover, the term "diac" as used here is meant to cover a wide range of similar negative resistance and breakdown devices.

While this invention has been described in detail with reference to selected preferred embodiments, the invention is certainly not limited to those embodiments. Rather, many modifications and variations would present themselves to those skilled in the art without departing from the scope and spirit of this invention, as defined in the appended claims.

What is claimed is:

1. A motor start circuit for an AC induction motor, said motor including at least one run winding coupled between a pair of AC power conductors, and a start winding, said motor start circuit having first and second connection terminals only and which are connected in series with said start winding, with the first connection terminal being connected to one end of said start winding and the second connection terminal being connected to one of said AC power conductors, for applying AC current to said start winding upon commencement of an application of AC current to said run winding and for removing said AC current from said start winding when said AC induction motor reaches an operating speed; the motor start circuit comprising a triac device having a main current path connected in series with said start winding and said one AC power conductor, and including means to produce a low dv/dt characteristic in the triac device so that the commencement of the application of current causes said AC current to flow through said main current path.

2. A motor start circuit according to claim 1 wherein said low dv/dt producing means includes a capacitor coupled between one main current terminal of the triac device and a gate of the triac device.

3. A motor start circuit according to claim 1 wherein said low dv/dt producing means includes a negative resistance device coupled between a main current terminal of said triac device and a gate of the triac device.

4. A motor start circuit according to claim 1 further comprising restart circuit means coupled to a gate electrode of said triac device for applying a restart triggering current thereto when an excessive load on said AC induction motor reduces its operating speed below a predetermined threshold.

5. A motor start circuit according to claim 4 wherein said restart circuit means includes a transistor device having a first current carrying electrode coupled to said main current terminal of said triac device, a second current-carrying electrode coupled to the gate of said triac device, and a control electrode; and a capacitor timing circuit connected to said control electrode.

6. A motor start circuit for an AC induction motor having an armature that includes at least one run winding and a start winding with said motor start circuit being connected in series with said start winding for applying an AC current from a pair of AC conductors to the start winding upon commencement of an application of AC current to said run winding, for removing the AC current from said start winding when said AC induction motor reaches an operating speed, and for reapplying the AC current to the start winding when said AC induction motor slows below said operating speed; the motor start circuit comprising a first triac having first and second main electrodes coupled in series with the start winding, and a gate;

a diac device having a first electrode coupled to the gate of the first triac, and a second electrode;

a feedback circuit connected between one of the main electrodes of the first triac and the second electrode of the diac device;

a second triac having first and second main electrodes coupled respectively to the second terminal of the diac device and to the second main terminal of the first triac, and a gate; and a bias network circuit connected in parallel with the start winding and having a reference point therein connected to the gate of the second triac.

7. A motor start circuit according to claim 6 wherein said AC induction motor includes a start capacitor, and said first triac has its main electrodes coupled in series between the start capacitor and the start winding.

8. A motor start circuit according to claim 6 wherein said feedback circuit includes a capacitor and resistor means for charging up said capacitor, said capacitor and said resistor means being connected in series between the first main electrode and the second main electrode of said first triac, with a junction between the capacitor and the resistor means being connected to the second electrode of the diac device; said second triac having its main current electrodes in parallel with said capacitor.

9. A motor start circuit for an AC induction motor having an armature that includes at least one run winding and a start winding with said motor start circuit being connected in series with said start winding for applying an AC current from a pair of AC conductors to the start winding upon commencement of an application of AC current to said run winding, for removing the AC current from said start winding when said AC induction motor reaches an operating speed, and for reapplying the AC current to the start winding when said AC induction motor slows below said operating speed; the motor start circuit comprising a first triac having first and second main electrodes coupled in series with the start winding, and a gate:

a disc device having a first electrode coupled to the gate of the first triac, and a second electrode:

a feedback circuit connected between one of the main electrodes of the first triac and the second electrode of the disc device;

a second triac having first and second main electrodes coupled respectively to the second terminal of the disc device and to the second main terminal of the first triac, and a gate; and a bias network circuit connected in parallel with the start winding and having a reference point therein connected to the gate of the second triac wherein said bias network includes first and second series resistors connected in parallel across said start winding and having a junction therebetween coupled to the gate of the second triac.

10. A two-wire motor start circuit for an AC induction motor having an armature that includes at least one run winding and a start winding, with the motor start circuit being connected in series with the start winding, said two-wire motor start circuit having two external corrections only, with one thereof being coupled to one end of said start winding and the other thereof being coupled to one of a pair of AC conductors, for applying AC current from said pair of AC conductors to said start winding upon commencement of an application of AC current to said run winding, for removing said AC current from said start winding when said AC induction motor reaches an operating speed, and for re-applying said AC current to said start winding when said motor slows below said operating speed; comprising a triac device having a main current path connected in series with said start winding, and gating means sensitive to AC voltage at said start winding to gate said triac device on at the commencement of the application of said AC current, to permit the triac device to gate off when said motor reaches said operating speed, and to re-gate the triac device on in response to a change in the AC voltage at said start winding.

11. A two-wire motor start circuit according to claim 10 wherein said gating means includes a negative resistance device coupled between said triac device gate and one of said AC conductors.

12. A motor start circuit according to claim 8, wherein said bias network includes a second resistor and a second capacitor connected in a series circuit, the bias network being in parallel with said start winding, and a second diac device connecting a junction of said second resistor and second capacitor to the gate of said second triac device.

13. The two-wire motor start circuit of claim 10 wherein said gating means includes a series circuit formed of a resistor, a first capacitor, and a second capacitor, with the resistor coupled to an anode of said triac device and the second capacitor coupled to a cathode of said triac device, and with a negative resistance device being coupled between a gate of said triac device and a junction of said first and second capacitors.

14. The two-wire motor start circuit of claim 13, further comprising a resistor connected in parallel with said second capacitor.

15. The two-wire motor start circuit of claim 14, further comprising a resistor coupling the gate and the cathode of said triac device.

16. A motor start circuit for an AC induction motor having an armature that includes at least one on winding and a start winding, with said motor start circuit being connected in series with said start winding for applying an AC current from a pair of AC conductors to the start winding upon commencement of an application of AC current to said run winding, for removing the AC current from said start winding when said AC induction motor reaches an operating speed, and for reapplying the AC current to the start winding when said AC induction motor slows below said operating speed; the motor start circuit comprising:

an upper multivibrator circuit formed of a main triac which has cathode and anode main terminals connected in series with said start winding and a gate, an upper diac device that has a first electrode connected to the gate of said main triac and a second electrode, and an upper series RC circuit formed of an upper resistor connected to the anode main terminal of said main triac and a capacitor connected at one end to the cathode main terminal of said main triac and at its other end to the second electrode of said upper diac device; and a lower multivibrator circuit formed of a pilot triac having an anode main terminal connected to said second electrode of said upper diac device, a cathode main terminal connected to the cathode main terminal of said main triac, and a gate, a lower diac device having a first electrode connected to the gate of said pilot triac, and a lower series RC circuit formed of a lower capacitor and a lower resistor having a junction therebetween coupled to the second terminal of said lower diac device, the lower series RC circuit being connected in parallel to said start winding.

17. A motor start circuit according to claim 16, wherein said upper RC circuit has a first predetermined time constant and said lower RC circuit has a second predetermined time constant shorter than said first predetermined time constant.

18. A motor start circuit according to claim 17, wherein said upper diac device has a first predetermined breakdown voltage, and said lower diac device has a second predetermined breakdown voltage higher than said first breakdown voltage.

* * * * *

UNITED STATES PATENT AND TRADEMARK OFFICE
CERTIFICATE OF CORRECTION

PATENT NO. : 5,589,753
DATED : December 31, 1996
INVENTOR(S) : Andrew S. Kadah

It is certified that error appears in the above-indentified patent and that said Letters Patent is hereby corrected as shown below:

Col 5, line 60, "SBS 30 beings to" should read --SBS 30 begins to--.

Col 8, line 56, "because of tune shorter time" should read --because of the shorter time--.

Col 11, line 31, "a disc device" should read --a diac device--.

Col 11, line 35, "the disc device" should read -- the diac device--.

Col 12, line 26, "at least one on winding" should read --at least one run winding--.

Signed and Sealed this

Eighth Day of April, 1997

*Attest:*

BRUCE LEHMAN

*Attesting Officer*   Commissioner of Patents and Trademarks